(12) United States Patent
Chae et al.

(10) Patent No.: US 9,500,946 B2
(45) Date of Patent: Nov. 22, 2016

(54) SIDEWALL SPACER PATTERNING METHOD USING GAS CLUSTER ION BEAM

(71) Applicant: TEL Epion Inc., Billerica, MA (US)

(72) Inventors: Soo Doo Chae, Guilderland, NY (US); Youngdon Chang, Gyeonggi-do (KR); Il-seok Song, Gyeonggi-do (KR); Noel Russell, Waterford, NY (US)

(73) Assignee: TEL Epion Inc., Billerica, MA (US)

( * ) Notice: Subject to any disclaimer, the term of this patent is extended or adjusted under 35 U.S.C. 154(b) by 0 days.

(21) Appl. No.: 14/661,411

(22) Filed: Mar. 18, 2015

(65) Prior Publication Data

US 2016/0222521 A1    Aug. 4, 2016

Related U.S. Application Data

(60) Provisional application No. 62/109,487, filed on Jan. 29, 2015.

(51) Int. Cl.
| | |
|---|---|
| *H01L 21/302* | (2006.01) |
| *G03F 7/00* | (2006.01) |
| *H01L 21/308* | (2006.01) |
| *C23F 4/00* | (2006.01) |

(52) U.S. Cl.
CPC . *G03F 7/00* (2013.01); *C23F 4/00* (2013.01); *H01L 21/3086* (2013.01)

(58) Field of Classification Search
CPC .. C23F 1/00; H01L 21/31138; H01L 21/461; H01L 21/3086; H01L 21/30604; H01L 21/308; G02B 6/12097; G02B 6/1228; G02B 6/136

USPC ....... 438/706, 709, 710, 712, 714, 717, 719, 438/720, 725, 736
See application file for complete search history.

(56) References Cited

U.S. PATENT DOCUMENTS

| | | | | |
|---|---|---|---|---|
| 2002/0025636 | A1* | 2/2002 | Ju | H01L 21/76232 438/294 |
| 2007/0117342 | A1* | 5/2007 | Chen | H01L 21/31116 438/401 |
| 2008/0318384 | A1* | 12/2008 | Doyle | B82Y 10/00 438/282 |
| 2014/0138800 | A1* | 5/2014 | He | H01L 21/0337 257/632 |
| 2015/0132962 | A1* | 5/2015 | Hu | H01L 21/3086 438/703 |

* cited by examiner

*Primary Examiner* — Lan Vinh
(74) *Attorney, Agent, or Firm* — Wood Herron & Evans LLP

(57) ABSTRACT

A method for patterning a substrate is described. The method includes receiving a substrate having a patterned layer, wherein the patterned layer defines a first mandrel pattern, and wherein a first material layer of a first composition is conformally deposited over the first mandrel pattern. The method further includes partially removing the first material layer using a first gas cluster ion beam (GCIB) etching process to expose a top surface of the first mandrel pattern, open a portion of the first material layer at a bottom region adjacent a feature of the first mandrel pattern, and retain a remaining portion of the first material layer on sidewalls of the first mandrel pattern; and selectively removing the first mandrel pattern using one or more etching processes to leave a second mandrel pattern comprising the remaining portion of the first material layer that remained on the sidewalls of the first mandrel pattern.

20 Claims, 6 Drawing Sheets

SIDEWALL SPACER PATTERNING METHOD USING GAS CLUSTER ION BEAM

CROSS-REFERENCE TO RELATED APPLICATIONS

Pursuant to 37 C.F.R. §1.78(a)(4), this application claims the benefit of and priority to U.S. Provisional Application No. 62/109,487, filed on Jan. 29, 2015, which is expressly incorporated by reference herein in its entirety.

FIELD OF INVENTION

The invention relates to a method of patterning a substrate, and particularly, a method for performing sidewall spacer patterning.

BACKGROUND OF THE INVENTION

In material processing methodologies, pattern etching comprises the application of a layer of radiation-sensitive material, such as photo-resist, to an upper surface of a substrate, the formation of a pattern in the layer of radiation-sensitive material using photo-lithography, and the transfer of the pattern formed in the layer of radiation-sensitive material to an underlying thin film on the substrate using an etching process. The patterning of the radiation-sensitive material generally involves exposure of the radiation-sensitive material to a pattern of electromagnetic (EM) radiation using, for example, a photo-lithography system, followed by the removal of the irradiated regions of the radiation-sensitive material (as in the case of positive tone resist), or non-irradiated regions (as in the case of negative tone resist) using a developing solution.

More recently, a double patterning approach has been introduced to allow the patterning of smaller features at a smaller pitch than what is currently possible with standard lithographic techniques. One approach to reduce the feature size is to use standard lithographic pattern and etch techniques on the same substrate twice (i.e., LELE, or Litho/Etch-Litho/Etch), thereby forming larger patterns spaced closely together to achieve a smaller feature size than would be possible by single exposure. During LELE double patterning, the substrate is exposed to a first pattern, the first pattern is developed in the radiation-sensitive material, the first pattern formed in the radiation-sensitive material is transferred to an underlying layer using an etching process, and then this series of steps is repeated for a second pattern.

In another approach, the feature size is reduced by repeating the exposure of a standard lithographic pattern on the same substrate twice followed by etch techniques (i.e., LLE—Litho/Litho/Etch, or LFLE—Litho/Freeze-Litho/Etch), thereby forming larger patterns spaced closely together to achieve a smaller feature size than would be possible by single exposure. During LLE double patterning, the substrate is exposed to a first pattern, the substrate is exposed to a second pattern, the first pattern and the second pattern are developed in the radiation-sensitive material, and the first pattern and the second pattern formed in the radiation-sensitive material are transferred to an underlying layer using an etching process. During LFLE, an intervening developing and freezing step is inserted following the first exposure to "freeze" or cross-link the first pattern in the double pattern.

In yet another approach, the feature size is reduced by performing sidewall image transfer. Therein, a thin film is conformally applied to a lithographic pattern, which acts as a mandrel, and then partially removed to form a sidewall spacer on a sidewall of the mandrel. During the partial removal of the thin film from the patterned mandrel and the substrate, the success of a spacer etch process is determined by measuring, among other things, the following performance metrics: (a) the size of the sidewall spacer footing, (b) the depth of the substrate recess, (c) the amount of sidewall spacer critical dimension (CD) slimming, and (d) the depth of the spacer top recess or facet. Conventional spacer etch processes produce unacceptable results in at least one of these performance metrics.

SUMMARY OF THE INVENTION

Embodiments of the invention relate to a method of patterning a substrate, and particularly, a method for performing sidewall spacer patterning. In particular, some embodiments of the invention relate to gas cluster ion beam (GCIB) processing. Furthermore, other embodiments of the invention relate to GCIB processing to complement a sidewall spacer patterning process.

According to one embodiment, a method for patterning a substrate is described. The method includes receiving a substrate having a patterned layer, wherein the patterned layer defines a first mandrel pattern, and wherein a first material layer of a first composition is conformally deposited over the first mandrel pattern. The method further includes partially removing the first material layer using a first gas cluster ion beam (GCIB) etching process to expose a top surface of the first mandrel pattern, open a portion of the first material layer at a bottom region adjacent a feature of the first mandrel pattern, and retain a remaining portion of the first material layer on sidewalls of the first mandrel pattern; and selectively removing the first mandrel pattern using one or more etching processes to leave a second mandrel pattern comprising the remaining portion of the first material layer that remained on the sidewalls of the first mandrel pattern.

DETAILED DESCRIPTION OF SEVERAL EMBODIMENTS

Methods for patterning a substrate using gas cluster ion beam (GCIB) processing are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but does not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

Figure 1A:
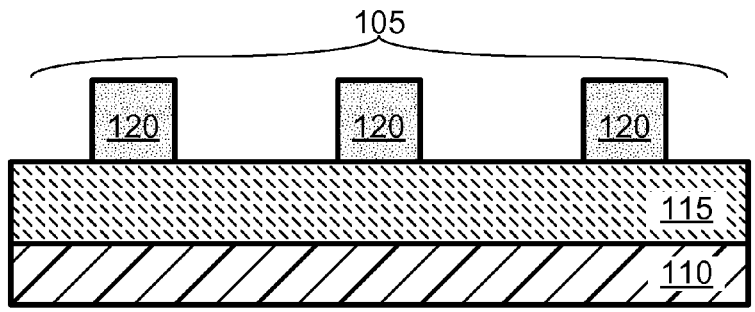
FIGS. 1A through 1D illustrate a schematic representation of a patterning method according to an embodiment.
Figure 1B:
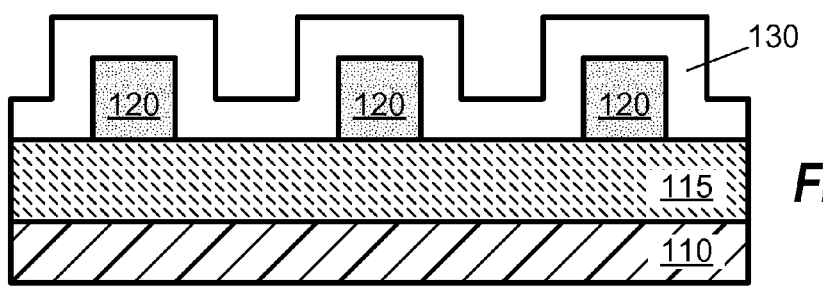

Referring now to the drawings, wherein like reference numerals designate identical or corresponding parts throughout the several views, FIGS. 1A through 1D, and FIG. 3 illustrate a method for patterning a substrate according to an embodiment. The method is pictorially illustrated in FIGS. 1A through 1D, and presented by way of a flow chart 300 in FIG. 3. As presented in FIG. 3, the flow chart 300 begins in 310 with receiving a substrate 110 having a patterned layer 130 overlying a device layer 115, wherein the patterned layer 120 defines a first mandrel pattern 105 (see FIG. 1A). The device layer 115 can include a thin film or structure on substrate 110 into which a pattern is to be transferred. The substrate 110 further includes a first material layer 130 of a first composition that is conformally deposited over the first mandrel pattern 105, as shown in FIG. 1B.

Figure 1C:
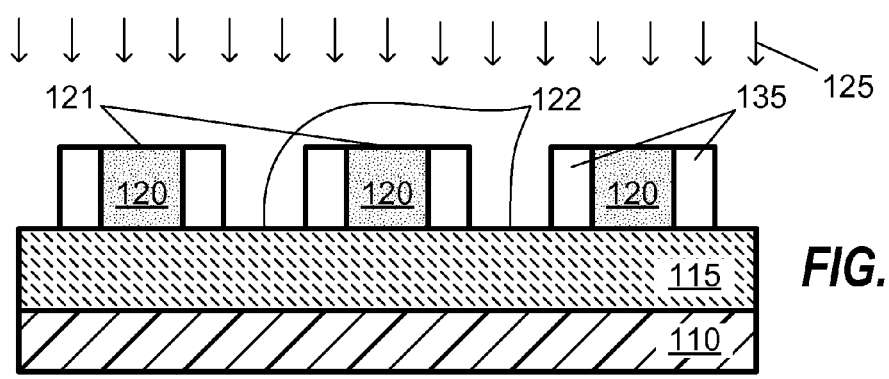

In 320 and as shown in FIG. 1C, the first material layer 130 is partially removed using a first gas cluster ion beam (GCIB) etching process 125 to expose a top surface 121 of the first mandrel pattern 105, open a portion of the first material layer 130 at a bottom region 122 adjacent a feature of the first mandrel pattern 105, and retain a remaining portion 135 of the first material layer 130 on sidewalls of the first mandrel pattern 105. The anisotropy, or angular distribution, of the GCIB in the first GCIB etching process can, among other things, be tailored to precisely define the remaining portion 135 on the sidewalls of the first mandrel pattern 105.

Figure 1D:
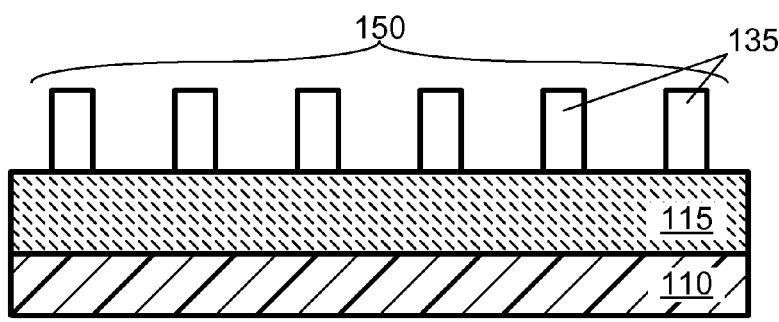

Then, in 330 and as shown in FIG. 1D, the first mandrel pattern 105 is selectively removed using one or more etching processes to leave a second mandrel pattern 150 comprising the remaining portion 135 of the first material layer 130 that remained on the sidewalls of the first mandrel pattern 105. In doing so, for example, the pattern is doubled from the first mandrel pattern 105 to the second mandrel pattern 150, and the pattern pitch is halved.

The substrate 110 can include a bulk silicon substrate, a single crystal silicon (doped or un-doped) substrate, a semiconductor-on-insulator (SOI) substrate, or any other semiconductor substrate containing, for example, Si, SiC, SiGe, SiGeC, Ge, GaAs, InAs, InP, as well as other III/V or II/VI compound semiconductors, or any combination thereof (Groups II, III, V, VI refer to the classical or old IUPAC notation in the Periodic Table of Elements; according to the revised or new IUPAC notation, these Groups would refer to Groups 2, 13, 15, 16, respectively). The substrate can be of any size, for example, a 200 mm (millimeter) substrate, a 300 mm substrate, a 450 mm substrate, or an even larger substrate. The device layer 115 can include any film or device structure into which a pattern can be transferred.

In one embodiment, the patterned layer 120 and the first mandrel pattern 105 can be prepared by spin-coating the substrate 110 with a thin film of photo-sensitive material and patterning the thin film using a lithographic process. For example, the patterned layer 120 can include a photo-resist, such as a 248 nm (nanometer) resist, a 193 nm resist, a 157 nm resist, an EUV (extreme ultraviolet) resist, an electron beam sensitive resist, or any type of thermal freeze photo-resist, electromagnetic (EM) radiation freeze photo-resist, or chemical freeze photo-resist.

During the lithographic process, spin-coating the substrate 110 with a thin layer of photo-sensitive material can be performed in a track system. For example, the track system can include a Clean Track ACT® 8, ACT® 12, LITHIUS®, LITHIUS™ Pro™, or LITHIUS™ Pro V™ resist coating and developing system commercially available from Tokyo Electron Limited (TEL). Other systems and methods for forming a photo-resist film on a substrate are well known to those skilled in the art of spin-on resist technology. The spin-coating process can be followed by one or more first post-application bakes (PAB) to heat the substrate 110 and one or more cooling cycles, following the one or more first PABs, to cool the substrate 110.

Thereafter, the photo-sensitive material can be imaged in a radiation exposure system and developed in a developing system to produce the first mandrel pattern 105. The radiation exposure system may include a dry or wet photo-lithography system, including any suitable stepping/scanning lithography system. For example, the photo-lithography system may be commercially available from Nikon Corporation, ASML Netherlands B.V., or Canon, Inc. Alternatively, the first image pattern may be formed using an electron beam lithography system. The developing system can be located on the track system described above. The developing process may be preceded by one or more first post-exposure bakes (PEB) to heat the substrate 110 and one or more cooling cycles, following the one or more first PEBs, to cool the substrate 110.

In another embodiment, the patterned layer 120 and the first mandrel pattern 105 can be prepared by depositing a thin film and patterning the thin film using lithographic and etch processes. For example, the patterned layer 120 can include a silicon-containing material, a carbon-containing material, or a metal-containing material. Examples include silicon, silicon oxide, silicon nitride, silicon carbide, carbon, metal oxide, metal nitride, etc. Other examples include silicon (Si) and one or more elements selected from the group consisting of O, N, H, and C. Yet other examples include a metal (e.g., Ti, Ta, etc.) and one or more elements selected from the group consisting of O, N, H, and C.

The patterned layer 120 and the first mandrel pattern 105 can be prepared using chemical vapor deposition (CVD), plasma-enhanced CVD (PECVD), filament-assisted or pyrolytic CVD, atomic layer deposition (ALD), plasma enhanced ALD (PEALD), or physical vapor deposition (PVD), for example. The patterned layer 120 can be un-doped or doped using an implant or infusion process.

In another embodiment, the first material layer 130 of a first composition can be prepared by depositing a thin film using techniques that provide a relatively high degree of conformality. For example, the patterned layer 120 can include a silicon-containing material, a carbon-containing material, or a metal-containing material. Examples include silicon, silicon oxide, silicon nitride, silicon carbide, carbon, metal oxide, metal nitride, etc. Other examples include silicon (Si) and one or more elements selected from the group consisting of O, N, H, and C. Yet other examples include a metal (e.g., Ti, Ta, etc.) and one or more elements selected from the group consisting of O, N, H, and C.

The first material layer 130 can be conformally deposited using chemical vapor deposition (CVD), plasma-enhanced CVD (PECVD), filament-assisted or pyrolytic CVD, atomic layer deposition (ALD), plasma enhanced ALD (PEALD), or physical vapor deposition (PVD), for example. The first material layer 130 can be un-doped or doped using an implant or infusion process.

The patterned layer 120 and the first material layer 130 are selected to be of different material composition to allow selective removal of one material relative to the other. In one example, the patterned layer 120 includes a patterned photo-sensitive material, and the first material layer 130 includes a silicon containing material, a carbon containing material, or a metal containing material (e.g., silicon oxide, silicon nitride, amorphous carbon, or metal oxide). In another example, the patterned layer 120 includes a patterned silicon oxide layer, and the first material layer 130 includes a silicon nitride layer. In yet another embodiment, the patterned layer 120 includes a patterned silicon nitride layer, and the first material layer 130 includes a silicon oxide layer.

As described above in reference to FIG. 1C, the first material layer 130 is partially removed using the first GCIB etching process 125. As deposited, the first material layer 130 characterized by an initial material layer critical dimension (CD), or thickness along a sidewall of the features in the patterned layer 120. The initial material layer CD can range from about 2 nm (nanometers) to about 20 nm, or preferably from about 5 nm to about 15 nm, or more preferably from about 8 nm to about 12 nm (e.g., about 9-10 nm).

During the partial removal of the first material layer 130 from the first mandrel pattern 105 and the substrate 110 to create the remaining portion 135 of the first material layer 130 on the sidewalls of the first mandrel pattern 105 formed by the patterned layer 120, the partial removal process is evaluated by measuring, among other things, the following performance metrics: (a) the amount of CD reduction or slimming of the first material layer 130 along the sidewall of the first mandrel pattern 105, (b) the existence and/or size of a sidewall footing, (c) the amount of recess exhibited in an exposed surface of the device layer 115 or the substrate 110, (d) the amount of faceting exhibited in the first material layer 130 proximate the top of the first mandrel pattern 105, and (e) the amount of patterned layer 120 consumed from the top surface of the patterned layer 120.

When using dry plasma etching techniques to perform the partial removal, unacceptable results can be produced in at least one of these performance metrics. For example, the amount of CD reduction or slimming can be excessive, and oftentimes can exceed 20%, 30%, and even 50% the initial material CD. Additionally, for example, a footing can remain, or excessive recessing and/or faceting can occur. For example, the resultant structure can exhibit any one of the following: (i) a substrate recess formed in an exposed surface of device layer 115 or substrate 110 and characterized by a recess depth that may exceed 1 nm, 2 nm, and even 5 nm; (ii) a facet at a top of the resultant structure characterized by a facet depth that may exceed 1 nm, 2 nm, and even 5 nm; and (iii) an amount of mandrel material consumed from the top surface of the patterned layer 120 exceeding 5 nm.

According to several embodiments, during the partial removal of the first material layer 130, the use of the first GCIB etching process 125, to be described in greater detail, can produce acceptable results in at least one of the aforementioned performance metrics. For example, the difference between a final material CD and the initial material CD is a measure of the amount of CD reduction or slimming of the first material layer 130. The amount of CD reduction or slimming may be reduced to less than 2 nm, and desirably less than 1 nm. Alternatively, the amount of CD reduction or slimming may be reduced to less than 20%, and desirably less than 10% of the initial material CD.

Additionally, for example, the following can be achieved: (i) reduction or avoidance of a footer; (ii) a reduced recess formed in an exposed surface of the device layer 115 or substrate 110 and characterized by a recess depth that is less than 3 nm, 2 nm, 1.5 nm, and even 1 nm; (iii) a facet characterized by a facet depth that is less than 5 nm, 2 nm, and even 1 nm; and (iv) an amount of material consumed from the patterned layer 120 that is less than 5 nm, 2 nm, and even 1 nm.

According to another embodiment, FIGS. 2A through 2C, and FIG. 4 illustrate a method for patterning a substrate according to an embodiment. The method is pictorially illustrated in FIGS. 2A through 2C, and presented by way of a flow chart 400 in FIG. 4. As presented in FIG. 4, the flow chart 400 begins in 410 with conformally depositing a second material layer 140 of a second composition over the second mandrel pattern 150, wherein the second composition being different from the first composition. In one example, the patterned layer 120 includes a patterned photo-sensitive material, the first material layer 130 includes silicon oxide, and the second material layer 140 includes silicon nitride.

Figure 2A:
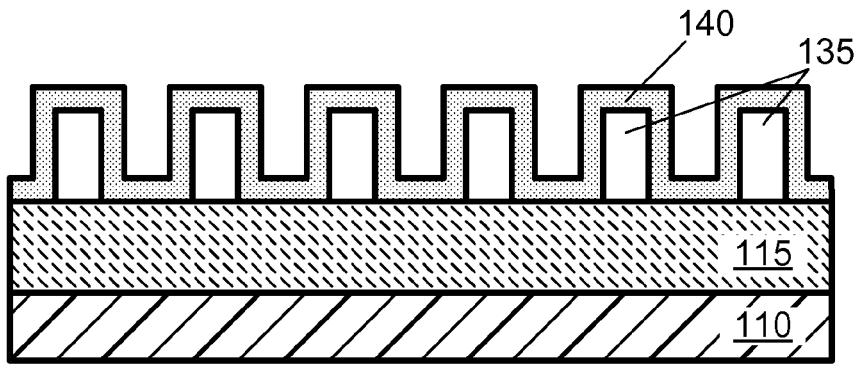
FIGS. 2A through 2C illustrate a schematic representation of a patterning method according to another embodiment.
Figure 2B:
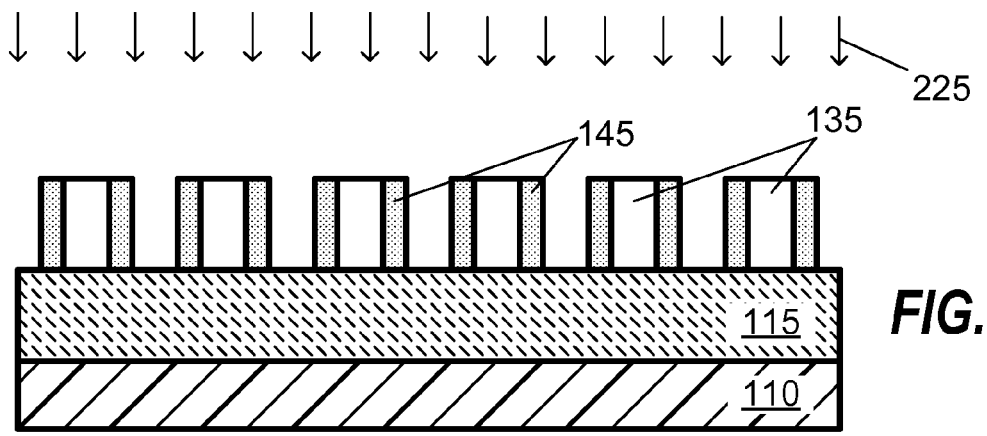

In 420 and as shown in FIG. 2B, the second material layer 140 is partially removed using a second gas cluster ion beam (GCIB) etching process 225 to expose a top surface of the second mandrel pattern 150, open a portion of the second material layer 140 at a bottom region adjacent a feature of the second mandrel pattern 150, and retain a remaining portion 145 of the second material layer 140 on sidewalls of the second mandrel pattern 150.

Figure 2C:
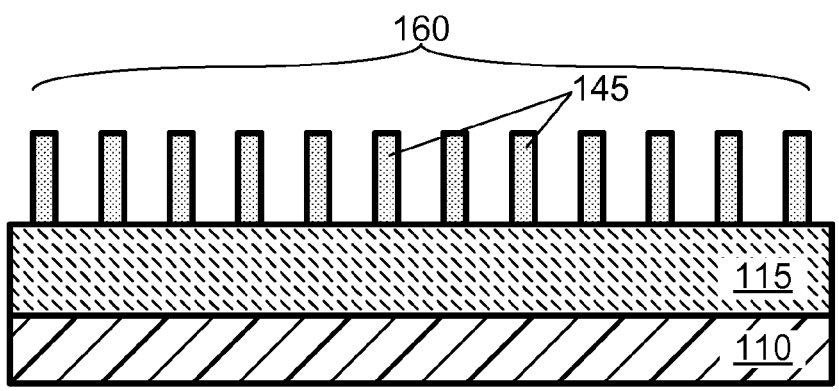
Figure 3:
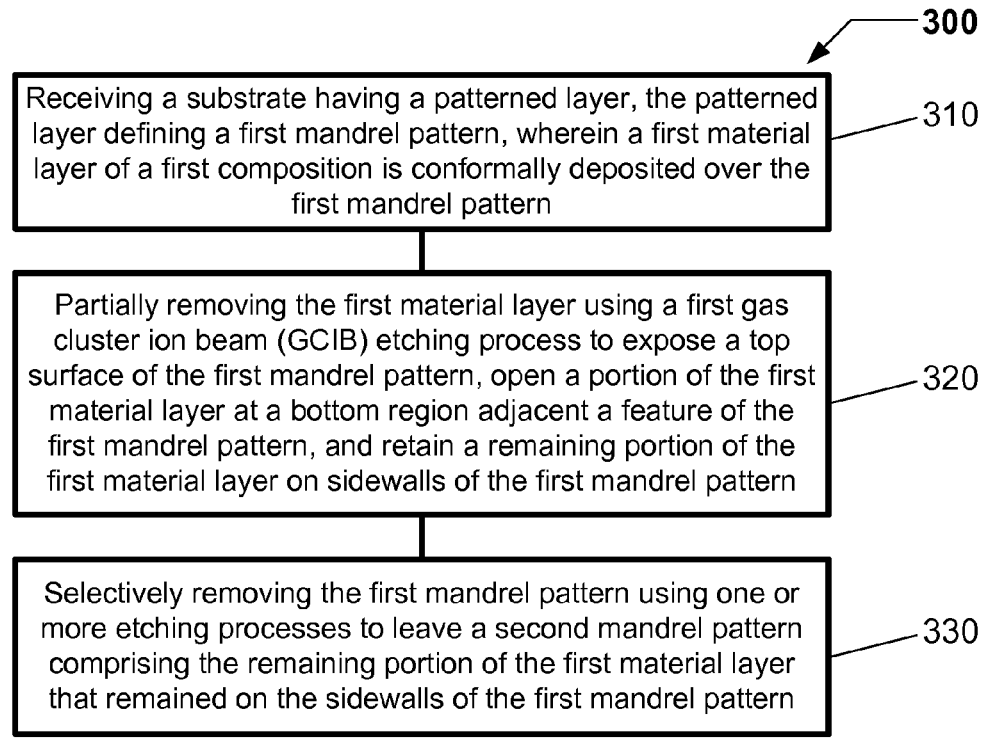
FIG. 3 provides a flow chart illustrating a method for patterning a substrate according to another embodiment.
Figure 4:
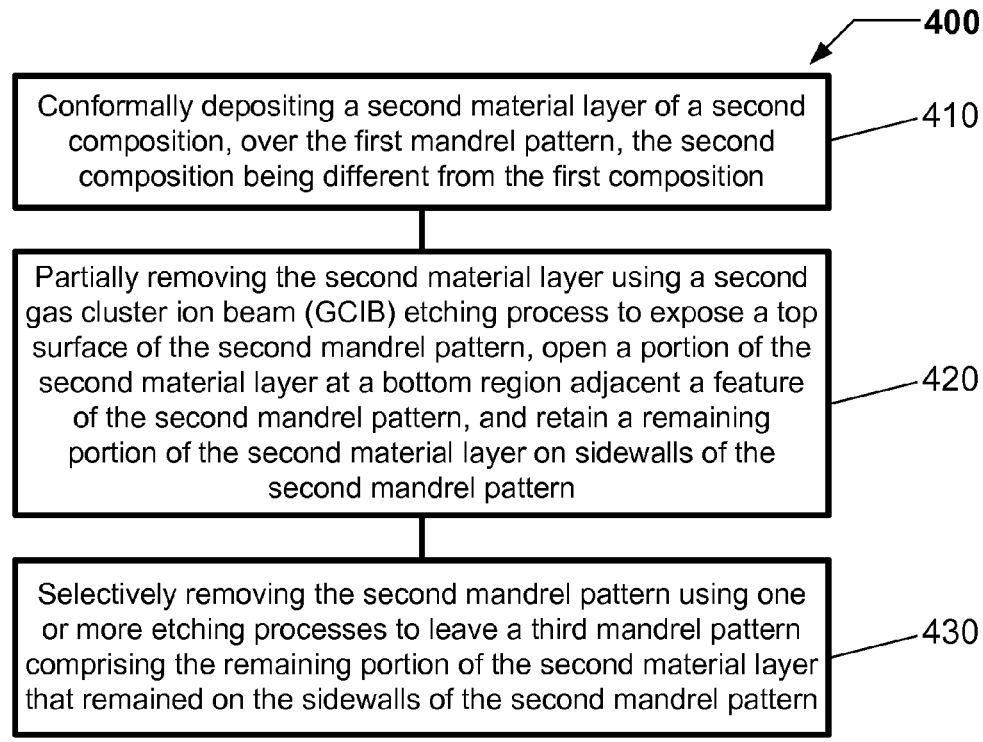
FIG. 4 provides a flow chart illustrating a method for patterning a substrate according to additional embodiments.

Then, in 430 and as shown in FIG. 2C, the second mandrel pattern 150 is selectively removed using one or more etching processes to leave a third mandrel pattern 160 comprising the remaining portion 145 of the second material layer 140 that remained on the sidewalls of the second mandrel pattern 150. In doing so, for example, the pattern is doubled yet again from the second mandrel pattern 150 to the third mandrel pattern 160, and the pattern pitch is halved (or quartered relative to the first mandrel pattern 105).

As described above in reference to FIG. 2B, the second material layer 140 is partially removed using the second GCIB etching process 225. As deposited, the second material layer 140 is characterized by an initial material layer critical dimension (CD), or thickness along a sidewall of the features in the remaining portion 135. The initial material layer CD can range from about 2 nm (nanometers) to about 20 nm, or preferably from about 5 nm to about 15 nm, or more preferably from about 8 nm to about 12 nm (e.g., about 9-10 nm).

During the partial removal of the second material layer 140 from the second mandrel pattern 150 and the substrate 110 to create the remaining portion 145 of the second material layer 140 on the sidewalls of the second mandrel pattern 150 formed by the remaining portion 135 of the first material layer 130, the partial removal process is evaluated by measuring, among other things, the following performance metrics: (a) the amount of CD reduction or slimming of the second material layer 140 along the sidewall of the second mandrel pattern 150, (b) the existence and/or size of a sidewall footing, (c) the amount of recess exhibited in an exposed surface of the device layer 115 or the substrate 110, (d) the amount of faceting exhibited in the second material layer 140 proximate the top of the second mandrel pattern 150, and (e) the amount of remaining portion 135 consumed from the top surface of the remaining portion 135 of the first material layer 130. According to several embodiments, during the partial removal of the second material layer 140, the use of the second GCIB etching process 225, to be described in greater detail, can produce acceptable results in at least one of the aforementioned performance metrics.

The first and second GCIB etching processes 125, 225 can include maintaining a reduced-pressure environment around a substrate holder for holding the substrate 110, and holding the substrate 110 securely within the reduced-pressure environment of a GCIB processing system. The GCIB processing system can include any one of the GCIB processing systems (500, 600, 700) described below in FIG. 5, 6, or 7, or any combination thereof. The temperature of substrate 110 may or may not be controlled. For example, substrate 110 may be heated or cooled during a GCIB etching process.

The first GCIB etching process 125 includes forming a first etching GCIB from a pressurized gas mixture containing a material suitable for selectively etching the first material layer 130. Furthermore, the second GCIB etching process 225 includes forming a second etching GCIB from a pressurized gas mixture containing a material suitable for selectively etching the second material layer 140. The first and/or second etching GCIB is formed by expanding the pressurized gas mixture through at least one nozzle into the GCIB processing system. The primary gas includes a pressurized gas mixture containing at least one atomic specie selected from the group consisting of He, Ne, Ar, Kr, Xe, B, C, H, Si, Ge, N, P, As, O, S, F, Cl, and Br. To form the first and/or second etching GCIB, constituents of the pressurized gas mixture should be selected that exist in a gaseous phase either alone or in combination with a carrier gas (e.g., a noble gas element or nitrogen) at relatively high pressure (e.g., a pressure of one atmosphere or greater).

In an embodiment, the first and/or second GCIB etching process 125, 225 includes forming the first and/or second etching GCIB from a pressurized gas mixture containing a halogen. For example, the pressurized gas mixture can contain a halide, a halomethane, a halosilane, or a halogermane, or any combination thereof.

In exemplary embodiments of the first and/or second GCIB etching process, the pressurized gas mixture can include $SiF_4$, $CHF_3$, $SF_6$, $NF_3$, and combinations thereof, when etching silicon-containing materials, silicon oxide, or oxidized silicon nitride. To form the first and/or second etching GCIB, constituents of the pressurized gas mixture should be selected that exist in a gaseous phase either alone or in combination with a carrier gas (e.g., a noble gas element or nitrogen) at relatively high pressure (e.g., a pressure of one atmosphere or greater). Additional details regarding the adjustment of GCIB process conditions to achieve etch selectivity between various materials and meet surface roughness requirements are provided in are provided in U.S. Pat. No. 8,512,586, entitled "Gas Cluster Ion Beam Etching Process for Achieving Target Etch Process Metrics for Multiple Materials" and filed on Aug. 20, 2013; and U.S. Patent Application Publication No. 2013/0196509A1, entitled "Gas Cluster Ion Beam Etching Process for Etching Si-Containing, Ge-Containing, and Metal-Containing Materials" and filed on Mar. 14, 2013; the contents of which are herein incorporated by reference in their entirety.

In another embodiment, the first and/or second etching GCIB may be generated by alternatingly and sequentially using a first pressurized gas mixture containing a modification or oxidation gas and a second pressurized gas mixture containing an etching gas. In yet other embodiments, a composition and/or a stagnation pressure of the first and/or second etching GCIB may be adjusted during the modifying and/or etching.

In other embodiments, one or more GCIB properties of a GCIB process condition for the first and/or second etching GCIB are set to achieve the one or more target process metrics, such as target etching process metrics for partially removing the first material layer 130 or the second material layer 140. To achieve the target etching process metrics noted above, such as a final material CD, a facet depth, a recess depth, an etch rate of the patterned layer 120, an etch rate of the first material layer 130, an etch rate of the second material layer, an etch selectivity between the first material layer and the patterned layer 120, an etch selectivity between the second material layer 140 and the first material layer 130, an etch selectivity between the first material layer 130 and the device layer 115, an etch selectivity between the second material layer 140 and the device layer 115, a surface roughness of the first material layer 130, a surface roughness of the second material layer 140, a surface roughness of the patterned layer 120, a surface roughness of the device layer 115, etc., the first and/or second etching GCIB may be generated by performing the following: selecting a beam acceleration potential, one or more beam focus potentials, and a beam dose; accelerating the first and/or second etching GCIB according to the beam acceleration potential; focusing the first and/or second etching GCIB to according to the one or more beam focus potentials; and irradiating at least a portion of the first and/or second etching GCIB onto at least a portion of the substrate according to the beam dose.

Furthermore, in addition to these GCIB properties, a GCIB composition, a beam energy, a beam energy distribution, a beam angular distribution, a beam divergence angle, a stagnation pressure, a stagnation temperature, a flow rate of the GCIB composition, a cluster size, a cluster size distribution, a beam size, a beam composition, a beam electrode potential, a gas nozzle design (such as nozzle throat diameter, nozzle length, and/or nozzle divergent section half-angle), a background gas pressure for an increased pressure region through which the GCIB passes, or a background gas flow rate for an increased pressure region through which the etching GCIB passes (e.g., a P-Cell value, as will be discussed in greater detail below) can be selected. Any one or more of the aforementioned GCIB properties can be selected to achieve control of target etching process metrics, such as those noted above.

The beam energy distribution function for the first and/or second etching GCIB may be modified by directing the respective first and/or second etching GCIB along a GCIB path through an increased pressure region such that at least a portion of the first and/or second etching GCIB traverses the increased pressure region. The extent of modification to the beam energy distribution may be characterized by a pressure-distance (d) integral along the at least a portion of the GCIB path. When the value of the pressure-distance integral is increased (either by increasing the pressure and/or the path length (d)), the beam energy distribution is broadened and the peak energy is decreased. When the value of the pressure-distance integral is decreased (either by decreasing the pressure and/or the path length (d)), the beam energy distribution is narrowed and the peak energy is increased. As an example, one may broaden the beam energy distribution to increase the beam divergence, or one may narrow the beam energy distribution to decrease the beam divergence.

The pressure-distance integral along the at least a portion of the GCIB path may be equal to or greater than about 0.0001 torr-cm. Alternatively, the pressure-distance integral along the at least a portion of the GCIB path may be equal to or greater than about 0.001 torr-cm. Alternatively yet, the pressure-distance integral along the at least a portion of the GCIB path may be equal to or greater than about 0.01 torr-cm. As an example, the pressure-distance integral along the at least a portion of the GCIB path may range from 0.0001 torr-cm to 0.01 torr-cm. As another example, the pressure-distance integral along the at least a portion of the GCIB path may range from 0.001 torr-cm to 0.01 torr-cm.

Alternatively, the beam energy distribution function for the first and/or second etching GCIB may be modified by modifying or altering a charge state of the respective first and/or second etching GCIB. For example, the charge state may be modified by adjusting an electron flux, an electron energy, or an electron energy distribution for electrons utilized in electron collision-induced ionization of gas clusters.

In another embodiment, the directionality of the first and/or second etching GCIB relative to normal incidence on the substrate may be adjusted by altering the beam angular distribution function. The beam angular distribution function or beam divergence angle may be modified using the aforementioned techniques described for modifying the beam energy distribution function.

In yet other embodiments, the first and/or second GCIB etching process for selectively removing regions of the first material layer 130 or second material layer 140, respectively, can include introduction of a secondary gas. The secondary gas can include at least one atomic specie selected from the group consisting of He, Ne, Ar, Kr, Xe, B, C, H, Si, Ge, N, P, As, O, S, F, Cl, and Br. As an example, the secondary gas can include a hydrogen-containing gas or vapor, or a halogen-containing gas or vapor, or combination thereof. The GCIB modification process or the GCIB etching process can take place during the supplying of the secondary gas, before the supplying of the secondary gas, or following the supplying of the secondary gas, or any combination of two or more thereof.

During irradiation, the first and/or second etching GCIB is accelerated through the reduced pressure environment towards substrate according to a beam acceleration potential. For the first and/or second GCIB, the beam acceleration potential may range up to 100 kV, the beam energy may range up to 100 keV, the cluster size may range up to several tens of thousands of atoms, and the beam dose may range up to about $1 \times 10^{17}$ clusters per $cm^2$. For example, the beam acceleration potential of the first and/or second GCIB may range from about 1 kV to about 70 kV (i.e., the beam energy may range from about 1 keV to about 70 keV, assuming an average cluster charge state of unity). Additionally, for example, the beam dose of the first and/or second GCIB may range from about $1 \times 10^{12}$ clusters per $cm^2$ to about $1 \times 10^{14}$ clusters per $cm^2$.

The first and/or second GCIB may be established having an energy per atom ratio ranging from about 0.25 eV per atom to about 100 eV per atom. Alternatively, the first and/or second GCIB may be established having an energy per atom ratio ranging from about 0.25 eV per atom to about 10 eV per atom. Alternatively, the first and/or second GCIB may be established having an energy per atom ratio ranging from about 1 eV per atom to about 10 eV per atom.

The establishment of the first and/or second GCIB having a desired energy per atom ratio may include selection of a beam acceleration potential, a stagnation pressure for formation of the first and/or second GCIB, or a gas flow rate, or any combination thereof. The beam acceleration potential may be used to increase or decrease the beam energy or energy per ion cluster. For example, an increase in the beam acceleration potential causes an increase in the maximum beam energy and, consequently, an increase in the energy per atom ratio for a given cluster size. Additionally, the stagnation pressure may be used to increase or decrease the cluster size for a given cluster. For example, an increase in the stagnation pressure during formation of the first and/or second GCIB causes an increase in the cluster size (i.e., number of atoms per cluster) and, consequently, a decrease in the energy per atom ratio for a given beam acceleration potential.

Herein, beam dose is given the units of number of clusters per unit area. However, beam dose may also include beam current and/or time (e.g., GCIB dwell time). For example, the beam current may be measured and maintained constant, while time is varied to change the beam dose. Alternatively, for example, the rate at which clusters strike the surface of the substrate per unit area (i.e., number of clusters per unit area per unit time) may be held constant while the time is varied to change the beam dose.

In other embodiments, the method described above may further include altering the one or more target process metrics to create one or more new target process metrics, and setting one or more additional GCIB properties of an additional GCIB process condition for the first and/or second GCIB to achieve the one or more new target process metrics.

According to one embodiment, in addition to irradiation of the substrate with the first and/or second etching GCIB, another GCIB may be used for additional control and/or function. Irradiation of the substrate by another GCIB, such as a third GCIB, may proceed before, during, or after use of the modifying or etching GCIB. For example, another GCIB may be used to dope a portion of the substrate with an impurity. Additionally, for example, another GCIB may be used to pre-modify a portion of the substrate to alter properties of the substrate. Additionally, for example, another GCIB may be used to etch a portion of the substrate to remove additional material from substrate. Additionally, for example, another GCIB may be used to clean a portion of the substrate to remove additional material or residue, such as halogen-containing residue, from substrate. Additionally yet, for example, another GCIB may be used to grow or deposit material on a portion of the substrate. The doping, modifying, etching, cleaning, growing, or depositing may comprise introducing one or more elements selected from the group consisting of He, Ne, Ar, Xe, Kr, B, C, Se, Te, Si, Ge, N, P, As, O, S, F, Cl, and Br.

According to another embodiment, the at least one portion of substrate subjected to etching GCIB irradiation may be cleaned before or after the irradiating with the first and/or second etching GCIB. For example, the cleaning process may include a dry cleaning process and/or a wet cleaning process. Additionally, the at least one portion of substrate subjected to GCIB irradiation may be annealed after the irradiating with the first and/or second GCIB.

According to yet another embodiment, when preparing and/or treating a substrate by GCIB processing, any portion of substrate may be subjected to corrective processing. During corrective processing, metrology data may be acquired using a metrology system coupled to a GCIB processing system, either in-situ or ex-situ. The metrology system may comprise any variety of substrate diagnostic systems including, but not limited to, optical diagnostic systems, X-ray fluorescence spectroscopy systems, four-point probing systems, transmission-electron microscope (TEM), atomic force microscope (AFM), scanning-electron microscope (SEM), etc. Additionally, the metrology system may comprise an optical digital profilometer (ODP), a scatterometer, an ellipsometer, a reflectometer, an interferometer, or any combination of two or more thereof.

For example, the metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035). Additionally, for example, the in-situ metrology system may include an integrated Optical Digital Profilometry (iODP) scatterometry module configured to measure metrology data on a substrate.

The metrology data may include parametric data, such as geometrical, mechanical, electrical and/or optical parameters associated with the substrate, any layer or sub-layer formed on the substrate, and/or any portion of a device on the substrate. For example, metrology data can include any parameter measurable by the metrology systems described above. Additionally, for example, metrology data can include a film thickness, a surface and/or interfacial roughness, a surface contamination, a feature depth, a trench depth, a via depth, a feature width, a trench width, a via width, a critical dimension (CD), an electrical resistance, or any combination of two or more thereof.

The metrology data may be measured at two or more locations on the substrate. Moreover, this data may be acquired and collected for one or more substrates. The one or more substrates may, for instance, include a cassette of substrates. The metrology data is measured at two or more locations on at least one of the one or more substrates and may, for example, be acquired at a plurality of locations on each of the one or more substrates. Thereafter, the plurality of locations on each of the plurality of substrates can be expanded from measured sites to unmeasured sites using a data fitting algorithm. For example, the data fitting algorithm can include interpolation (linear or nonlinear) or extrapolation (linear or nonlinear) or a combination thereof.

Once metrology data is collected for the one or more substrates using the metrology system, the metrology data is provided to a controller for computing correction data. Metrology data may be communicated between the metrology system and the controller via a physical connection (e.g., a cable), or a wireless connection, or a combination thereof. Additionally, the metrology data may be communicated via an intranet or Internet connection. Alternatively, metrology data may be communicated between the metrology system and the controller via a computer readable medium.

Correction data may be computed for location specific processing of the substrate. The correction data for a given substrate comprises a process condition for modulation of the GCIB dose as a function of position on the substrate in order to achieve a change between the parametric data associated with the incoming metrology data and the target parametric data for the given substrate. For example, the correction data for a given substrate can comprise determining a process condition for using the GCIB to correct a non-uniformity of the parametric data for the given substrate. Alternatively, for example, the correction data for a given substrate can comprise determining a process condition for using the GCIB to create a specifically intended non-uniformity of the parametric data for the given substrate.

Using an established relationship between the desired change in parametric data and the GCIB dose and an established relationship between the GCIB dose and a GCIB process condition having a set of GCIB processing parameters, the controller determines correction data for each substrate. For example, a mathematical algorithm can be employed to take the parametric data associated with the incoming metrology data, compute a difference between the incoming parametric data and the target parametric data, invert the GCIB processing pattern (i.e., etching pattern or deposition pattern or both) to fit this difference, and create a beam dose contour to achieve the GCIB processing pattern using the relationship between the change in parametric data and the GCIB dose. Thereafter, for example, GCIB processing parameters can be determined to affect the calculated beam dose contour using the relationship between the beam dose and the GCIB process condition. The GCIB processing parameters can include a beam dose, a beam area, a beam profile, a beam intensity, a beam scanning rate, or an exposure time (or beam dwell time), or any combination of two or more thereof.

Many different approaches to the selection of mathematical algorithm may be successfully employed in this embodiment. In another embodiment, the beam dose contour may selectively deposit additional material in order to achieve the desired change in parametric data.

The correction data may be applied to the substrate using a GCIB. During corrective processing, the GCIB may be configured to perform at least one of smoothing, amorphizing, modifying, doping, etching, growing, or depositing, or any combination of two or more thereof. The application of the corrective data to the substrate may facilitate correction of substrate defects, correction of substrate surface planarity, correction of layer thickness, or improvement of layer adhesion. Once processed to GCIB specifications, the uniformity of the substrate(s) or distribution of the parametric data for the substrate(s) may be examined either in-situ or ex-situ, and the process may be finished or refined as appropriate.

One or more of the methods for performing a patterning process according to various embodiments described above may be performed in any one of the GCIB processing systems illustrated in FIGS. 5 through 7 and described below. GCIB processing systems 500, 600, 700 may be used to etch, grow, deposit, dope, modify, or smooth layers or structures on the substrate.

Therefore, according to various embodiments, systems and methods for treating a substrate with a GCIB are described. Referring now to the drawings wherein like reference numerals designate corresponding parts throughout the several views, FIG. 5 provides a schematic illustration of a GCIB processing system 500 for treating a substrate according to an embodiment. The GCIB processing system 500 comprises a vacuum vessel 502, substrate holder 550, upon which a substrate 552 to be processed is affixed, and vacuum pumping systems 570A, 570B, and 570C. Substrate 552 can be a semiconductor substrate, a wafer, a flat panel display (FPD), a liquid crystal display (LCD), or any other workpiece. GCIB processing system 500 is configured to produce a GCIB for treating substrate 552.

Figure 5:
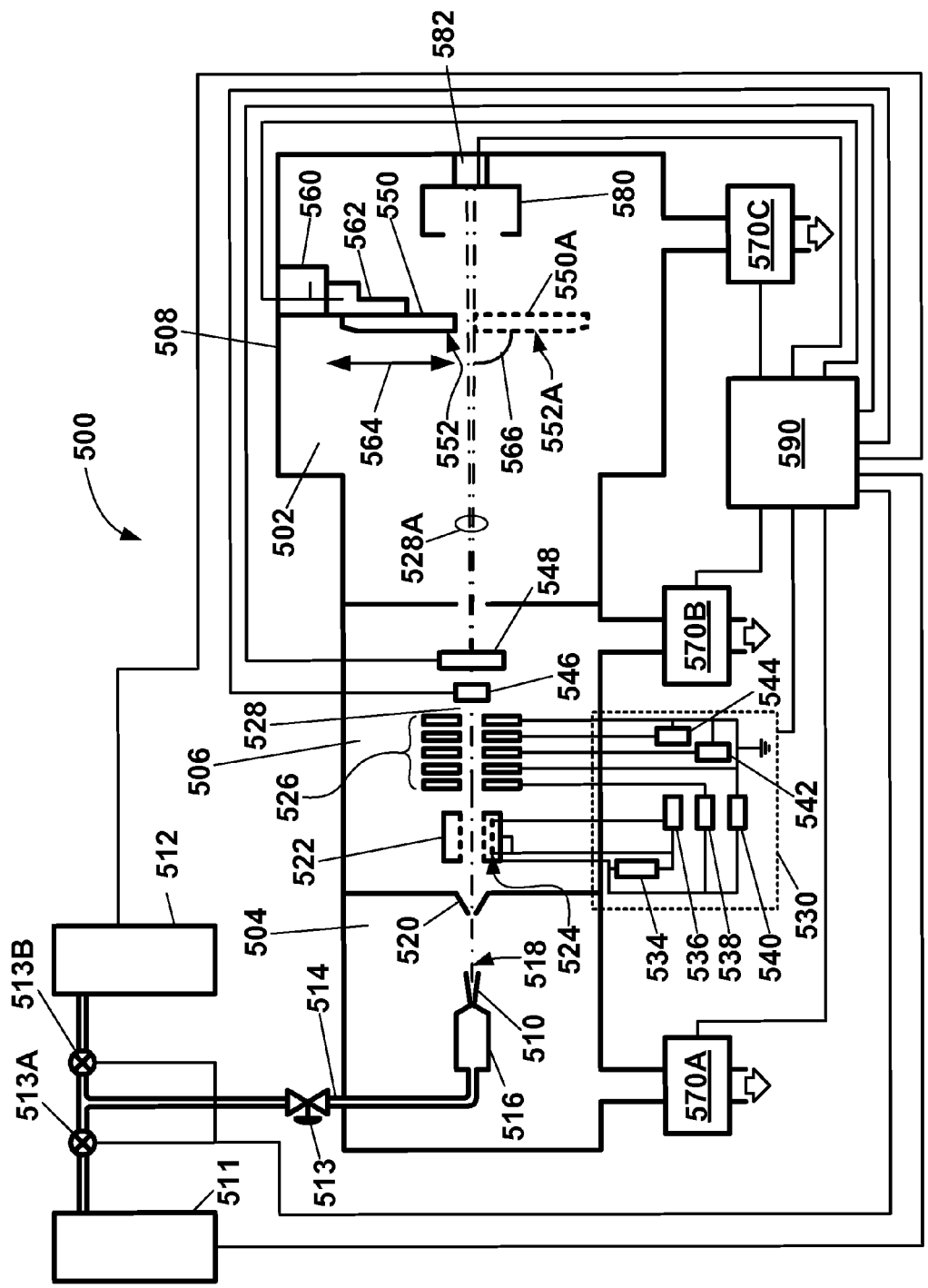
FIG. 5 is an illustration of a GCIB processing system.

Referring still to GCIB processing system 500 in FIG. 5, the vacuum vessel 502 comprises three communicating chambers, namely, a source chamber 504, an ionization/acceleration chamber 506, and a processing chamber 508 to provide a reduced-pressure enclosure. The three chambers are evacuated to suitable operating pressures by vacuum pumping systems 570A, 570B, and 570C, respectively. In the three communicating chambers 504, 506, 508, a gas cluster beam can be formed in the first chamber (source chamber 504), while a GCIB can be formed in the second chamber (ionization/acceleration chamber 506) wherein the gas cluster beam is ionized and accelerated. Then, in the third chamber (processing chamber 508), the accelerated GCIB may be utilized to treat substrate 552.

As shown in FIG. 5, GCIB processing system 500 can comprise one or more gas sources configured to introduce one or more gases or mixture of gases to vacuum vessel 502. For example, a first gas composition stored in a first gas source 511 is admitted under pressure through a first gas control valve 513A to a gas metering valve or valves 513. Additionally, for example, a second gas composition stored in a second gas source 512 is admitted under pressure through a second gas control valve 513B to the gas metering valve or valves 513. Further, for example, the first gas composition or second gas composition or both can include a condensable inert gas, carrier gas or dilution gas. For example, the inert gas, carrier gas or dilution gas can include a noble gas, i.e., He, Ne, Ar, Kr, Xe, or Rn.

Furthermore, the first gas source 511 and the second gas source 512 may be utilized either alone or in combination with one another to produce ionized clusters. The material composition can include the principal atomic or molecular species of the elements desired to react with or be introduced to the material layer.

The high pressure, condensable gas comprising the first gas composition or the second gas composition or both is introduced through gas feed tube 514 into stagnation chamber 516 and is ejected into the substantially lower pressure vacuum through a properly shaped nozzle 510. As a result of the expansion of the high pressure, condensable gas from the stagnation chamber 516 to the lower pressure region of the source chamber 504, the gas velocity accelerates to supersonic speeds and gas cluster beam 518 emanates from nozzle 510.

The inherent cooling of the jet as static enthalpy is exchanged for kinetic energy, which results from the expansion in the jet, causes a portion of the gas jet to condense and form a gas cluster beam 518 having clusters, each consisting of from several to several thousand weakly bound atoms or molecules. A gas skimmer 520, positioned downstream from the exit of the nozzle 510 between the source chamber 504 and ionization/acceleration chamber 506, partially separates the gas molecules on the peripheral edge of the gas cluster beam 518, that may not have condensed into a cluster, from the gas molecules in the core of the gas cluster beam 518, that may have formed clusters. Among other reasons, this selection of a portion of gas cluster beam 518 can lead to a reduction in the pressure in the downstream regions where higher pressures may be detrimental (e.g., ionizer 522, and processing chamber 508). Furthermore, gas skimmer 520 defines an initial dimension for the gas cluster beam entering the ionization/acceleration chamber 506.

The GCIB processing system 500 may also include multiple nozzles with one or more skimmer openings. Additional details concerning the design of a multiple gas cluster ion beam system are provided in U.S. Patent Application Publication No. 2010/0193701 A1, entitled "Multiple Nozzle Gas Cluster Ion Beam System" and filed on Apr. 23, 2009; and U.S. Patent Application Publication No. 2010/0193472A1, entitled "Multiple Nozzle Gas Cluster Ion Beam Processing System and Method of Operating" and filed on Mar. 26, 2010; the contents of which are herein incorporated by reference in their entirety.

After the gas cluster beam 518 has been formed in the source chamber 504, the constituent gas clusters in gas cluster beam 518 are ionized by ionizer 522 to form GCIB 528. The ionizer 522 may include an electron impact ionizer that produces electrons from one or more filaments 524, which are accelerated and directed to collide with the gas clusters in the gas cluster beam 518 inside the ionization/acceleration chamber 506. Upon collisional impact with the gas cluster, electrons of sufficient energy eject electrons from molecules in the gas clusters to generate ionized molecules. The ionization of gas clusters can lead to a population of charged gas cluster ions, generally having a net positive charge.

As shown in FIG. 5, beam electronics 530 are utilized to ionize, extract, accelerate, and focus the GCIB 528. The beam electronics 530 include a filament power supply 536 that provides voltage $V_F$ to heat the ionizer filament 524.

Additionally, the beam electronics 530 include a set of suitably biased high voltage electrodes 526 in the ionization/acceleration chamber 506 that extracts the cluster ions from the ionizer 522. The high voltage electrodes 526 then accelerate the extracted cluster ions to a desired energy and focus them to define GCIB 528. The kinetic energy of the cluster ions in GCIB 528 typically ranges from about 1000 electron volts (1 keV) to several tens of keV. For example, GCIB 528 can be accelerated to 1 to 100 keV.

As illustrated in FIG. 5, the beam electronics 530 further include an anode power supply 534 that provides voltage $V_A$ to an anode of ionizer 522 for accelerating electrons emitted from ionizer filament 524 and causing the electrons to bombard the gas clusters in gas cluster beam 518, which produces cluster ions.

Additionally, as illustrated in FIG. 5, the beam electronics 530 include an extraction power supply 538 that provides voltage $V_{EE}$ to bias at least one of the high voltage electrodes 526 to extract ions from the ionizing region of ionizer 522 and to form the GCIB 528. For example, extraction power supply 538 provides a voltage to a first electrode of the high voltage electrodes 526 that is less than or equal to the anode voltage of ionizer 522.

Furthermore, the beam electronics 530 can include an accelerator power supply 540 that provides voltage $V_{ACC}$ to bias one of the high voltage electrodes 526 with respect to the ionizer 522 so as to result in a total GCIB acceleration energy equal to about $V_{ACC}$ electron volts (eV). For example, accelerator power supply 540 provides a voltage to a second electrode of the high voltage electrodes 526 that is less than or equal to the anode voltage of ionizer 522 and the extraction voltage of the first electrode.

Further yet, the beam electronics 530 can include lens power supplies 542, 544 that may be provided to bias some of the high voltage electrodes 526 with potentials (e.g., $V_{L1}$ and $V_{L2}$) to focus the GCIB 528. For example, lens power supply 542 can provide a voltage to a third electrode of the high voltage electrodes 526 that is less than or equal to the anode voltage of ionizer 522, the extraction voltage of the first electrode, and the accelerator voltage of the second electrode, and lens power supply 544 can provide a voltage to a fourth electrode of the high voltage electrodes 526 that is less than or equal to the anode voltage of ionizer 522, the extraction voltage of the first electrode, the accelerator voltage of the second electrode, and the first lens voltage of the third electrode.

Note that many variants on both the ionization and extraction schemes may be used. While the scheme described here is useful for purposes of instruction, another extraction scheme involves placing the ionizer and the first element of the extraction electrode(s) (or extraction optics) at $V_{ACC}$. This typically requires fiber optic programming of control voltages for the ionizer power supply, but creates a simpler overall optics train. The invention described herein is useful regardless of the details of the ionizer and extraction lens biasing.

A beam filter 546 in the ionization/acceleration chamber 506 downstream of the high voltage electrodes 526 can be utilized to eliminate monomers, or monomers and light cluster ions from the GCIB 528 to define a filtered process GCIB 528A that enters the processing chamber 508. In one embodiment, the beam filter 546 substantially reduces the number of clusters having 100 or less atoms or molecules or both. The beam filter may comprise a magnet assembly for imposing a magnetic field across the GCIB 528 to aid in the filtering process.

Referring still to FIG. 5, a beam gate 548 is disposed in the path of GCIB 528 in the ionization/acceleration chamber 106. Beam gate 548 has an open state in which the GCIB 528 is permitted to pass from the ionization/acceleration chamber 506 to the processing chamber 508 to define process GCIB 528A, and a closed state in which the GCIB 528 is blocked from entering the processing chamber 508. A control cable conducts control signals from control system 590 to beam gate 548. The control signals controllably switch beam gate 548 between the open or closed states.

A substrate 552, which may be a wafer or semiconductor wafer, a flat panel display (FPD), a liquid crystal display (LCD), or other substrate to be processed by GCIB processing, is disposed in the path of the process GCIB 528A in the processing chamber 508. Because most applications contemplate the processing of large substrates with spatially uniform results, a scanning system may be desirable to uniformly scan the process GCIB 528A across large areas to produce spatially homogeneous results.

An X-scan actuator 560 provides linear motion of the substrate holder 550 in the direction of X-scan motion (into and out of the plane of the paper). A Y-scan actuator 562 provides linear motion of the substrate holder 550 in the direction of Y-scan motion 564, which is typically orthogonal to the X-scan motion. The combination of X-scanning and Y-scanning motions translates the substrate 552, held by the substrate holder 550, in a raster-like scanning motion through process GCIB 528A to cause a uniform (or otherwise programmed) irradiation of a surface of the substrate 552 by the process GCIB 528A for processing of the substrate 552.

The substrate holder 550 disposes the substrate 552 at an angle with respect to the axis of the process GCIB 528A so that the process GCIB 528A has an angle of beam incidence 566 with respect to a substrate 552 surface. The angle of beam incidence 566 may be 90 degrees or some other angle, but is typically 90 degrees or near 90 degrees. During Y-scanning, the substrate 552 and the substrate holder 550 move from the shown position to the alternate position "A" indicated by the designators 552A and 550A, respectively. Notice that in moving between the two positions, the substrate 552 is scanned through the process GCIB 528A, and in both extreme positions, is moved completely out of the path of the process GCIB 528A (over-scanned). Though not shown explicitly in FIG. 5, similar scanning and over-scan is performed in the (typically) orthogonal X-scan motion direction (in and out of the plane of the paper).

A beam current sensor 580 may be disposed beyond the substrate holder 550 in the path of the process GCIB 528A so as to intercept a sample of the process GCIB 528A when the substrate holder 550 is scanned out of the path of the process GCIB 528A. The beam current sensor 580 is typically a Faraday cup or the like, closed except for a beam-entry opening, and is typically affixed to the wall of the vacuum vessel 502 with an electrically insulating mount 582.

As shown in FIG. 5, control system 590 connects to the X-scan actuator 560 and the Y-scan actuator 562 through electrical cable and controls the X-scan actuator 560 and the Y-scan actuator 562 in order to place the substrate 552 into or out of the process GCIB 528A and to scan the substrate 552 uniformly relative to the process GCIB 528A to achieve desired processing of the substrate 552 by the process GCIB 528A. Control system 590 receives the sampled beam current collected by the beam current sensor 580 by way of an electrical cable and, thereby, monitors the GCIB and controls the GCIB dose received by the substrate 552 by removing the substrate 552 from the process GCIB 528A when a predetermined dose has been delivered.

Figure 6:
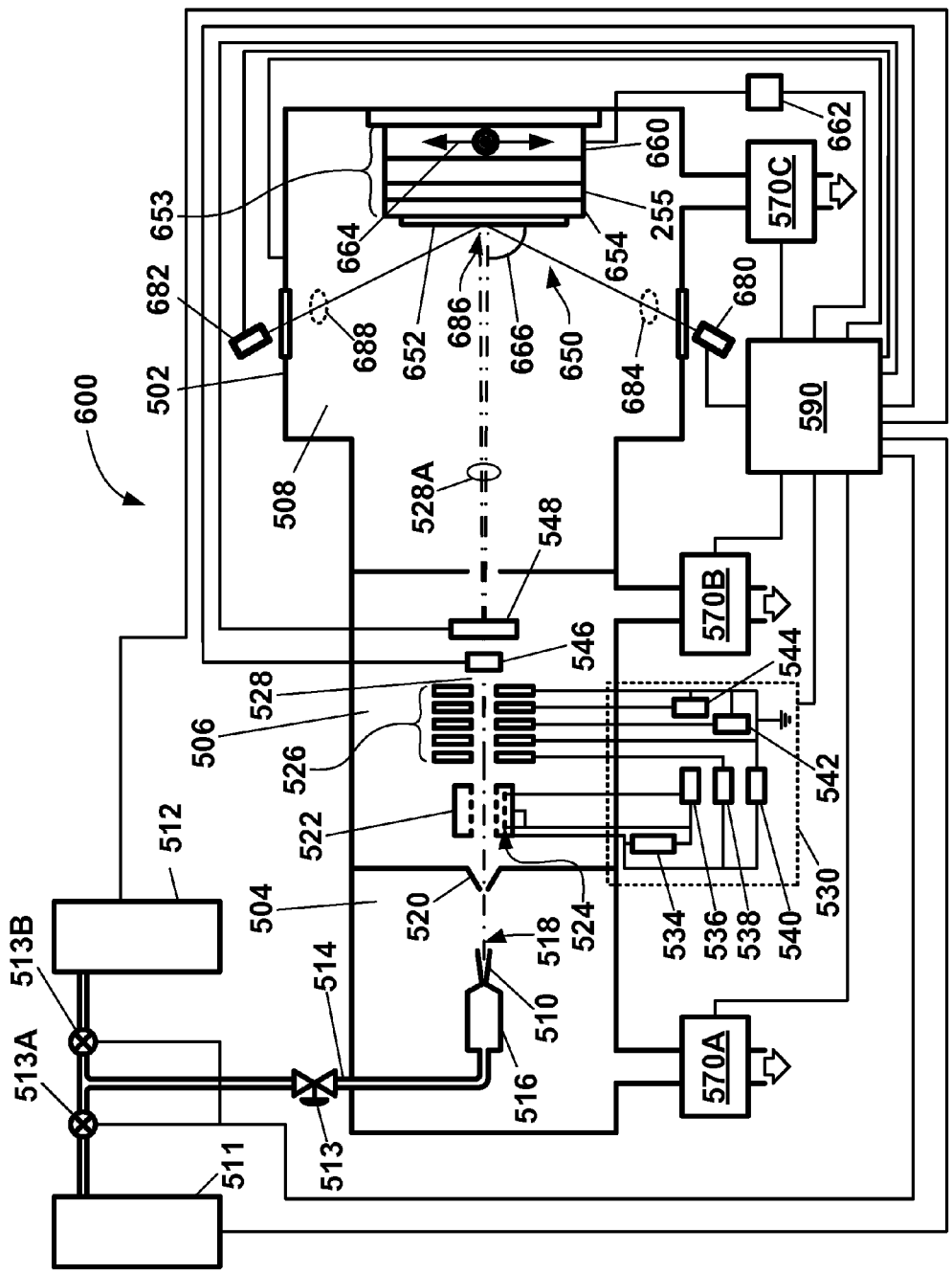
FIG. 6 is another illustration of a GCIB processing system.

In the embodiment shown in FIG. 6, the GCIB processing system 600 can be similar to the embodiment of FIG. 5 and further comprise a X-Y positioning table 653 operable to hold and move a substrate 652 in two axes, effectively scanning the substrate 652 relative to the process GCIB 528A. For example, the X-motion can include motion into and out of the plane of the paper, and the Y-motion can include motion along direction 664.

The process GCIB 528A impacts the substrate 652 at a projected impact region 686 on a surface of the substrate 652, and at an angle of beam incidence 666 with respect to the surface of substrate 652. By X-Y motion, the X-Y positioning table 653 can position each portion of a surface of the substrate 652 in the path of process GCIB 528A so that every region of the surface may be made to coincide with the projected impact region 686 for processing by the process GCIB 528A. An X-Y controller 662 provides electrical signals to the X-Y positioning table 653 through an electrical cable for controlling the position and velocity in each of X-axis and Y-axis directions. The X-Y controller 662 receives control signals from, and is operable by, control system 590 through an electrical cable. X-Y positioning table 653 moves by continuous motion or by stepwise motion according to conventional X-Y table positioning technology to position different regions of the substrate 652 within the projected impact region 686. In one embodiment, X-Y positioning table 653 is programmably operable by the control system 590 to scan, with programmable velocity, any portion of the substrate 652 through the projected impact region 686 for GCIB processing by the process GCIB 528A.

The substrate holding surface 654 of positioning table 653 is electrically conductive and is connected to a dosimetry processor operated by control system 590. An electrically insulating layer 655 of positioning table 653 isolates the substrate 652 and substrate holding surface 654 from the base portion 660 of the positioning table 653. Electrical charge induced in the substrate 652 by the impinging process GCIB 528A is conducted through substrate 652 and substrate holding surface 654, and a signal is coupled through the positioning table 653 to control system 590 for dosimetry measurement. Dosimetry measurement has integrating means for integrating the GCIB current to determine a GCIB processing dose. Under certain circumstances, a target-neutralizing source (not shown) of electrons, sometimes referred to as electron flood, may be used to neutralize the process GCIB 528A. In such case, a Faraday cup (not shown, but which may be similar to beam current sensor 580 in FIG. 5) may be used to assure accurate dosimetry despite the added source of electrical charge, the reason being that typical Faraday cups allow only the high energy positive ions to enter and be measured.

In operation, the control system 590 signals the opening of the beam gate 548 to irradiate the substrate 652 with the process GCIB 528A. The control system 590 monitors measurements of the GCIB current collected by the substrate 652 in order to compute the accumulated dose received by the substrate 652. When the dose received by the substrate 652 reaches a predetermined dose, the control system 190 closes the beam gate 548 and processing of the substrate 652 is complete. Based upon measurements of the GCIB dose received for a given area of the substrate 652, the control system 590 can adjust the scan velocity in order to achieve an appropriate beam dwell time to treat different regions of the substrate 652.

Alternatively, the process GCIB 528A may be scanned at a constant velocity in a fixed pattern across the surface of the substrate 652; however, the GCIB intensity is modulated (may be referred to as Z-axis modulation) to deliver an intentionally non-uniform dose to the sample. The GCIB intensity may be modulated in the GCIB processing system 100' by any of a variety of methods, including varying the gas flow from a GCIB source supply; modulating the ionizer 522 by either varying a filament voltage $V_F$ or varying an anode voltage $V_A$; modulating the lens focus by varying lens voltages $V_{L1}$ and/or $V_{L2}$; or mechanically blocking a portion of the GCIB with a variable beam block, adjustable shutter, or variable aperture. The modulating variations may be continuous analog variations or may be time modulated switching or gating.

The processing chamber 508 may further include an in-situ metrology system. For example, the in-situ metrology system may include an optical diagnostic system having an optical transmitter 680 and optical receiver 682 configured to illuminate substrate 652 with an incident optical signal 684 and to receive a scattered optical signal 688 from substrate 652, respectively. The optical diagnostic system comprises optical windows to permit the passage of the incident optical signal 684 and the scattered optical signal 688 into and out of the processing chamber 508. Furthermore, the optical transmitter 680 and the optical receiver 682 may comprise transmitting and receiving optics, respectively. The optical transmitter 680 receives, and is responsive to, controlling electrical signals from the control system 590. The optical receiver 682 returns measurement signals to the control system 590.

The in-situ metrology system may comprise any instrument configured to monitor the progress of the GCIB processing. According to one embodiment, the in-situ metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035).

For instance, the in-situ metrology system may include an integrated Optical Digital Profilometry (iODP) scatterometry module configured to measure process performance data resulting from the execution of a treatment process in the GCIB processing system 600. The metrology system may, for example, measure or monitor metrology data resulting from the treatment process. The metrology data can, for example, be utilized to determine process performance data that characterizes the treatment process, such as a process rate, a relative process rate, a feature profile angle, a critical dimension, a feature thickness or depth, a feature shape, etc. For example, in a process for directionally depositing material on a substrate, process performance data can include a critical dimension (CD), such as a top, middle or bottom CD in a feature (i.e., via, line, etc.), a feature depth, a material thickness, a sidewall angle, a sidewall shape, a deposition rate, a relative deposition rate, a spatial distribution of any parameter thereof, a parameter to characterize the uniformity of any spatial distribution thereof, etc. Operating the X-Y positioning table 653 via control signals from control system 590, the in-situ metrology system can map one or more characteristics of the substrate 652.

Figure 7:
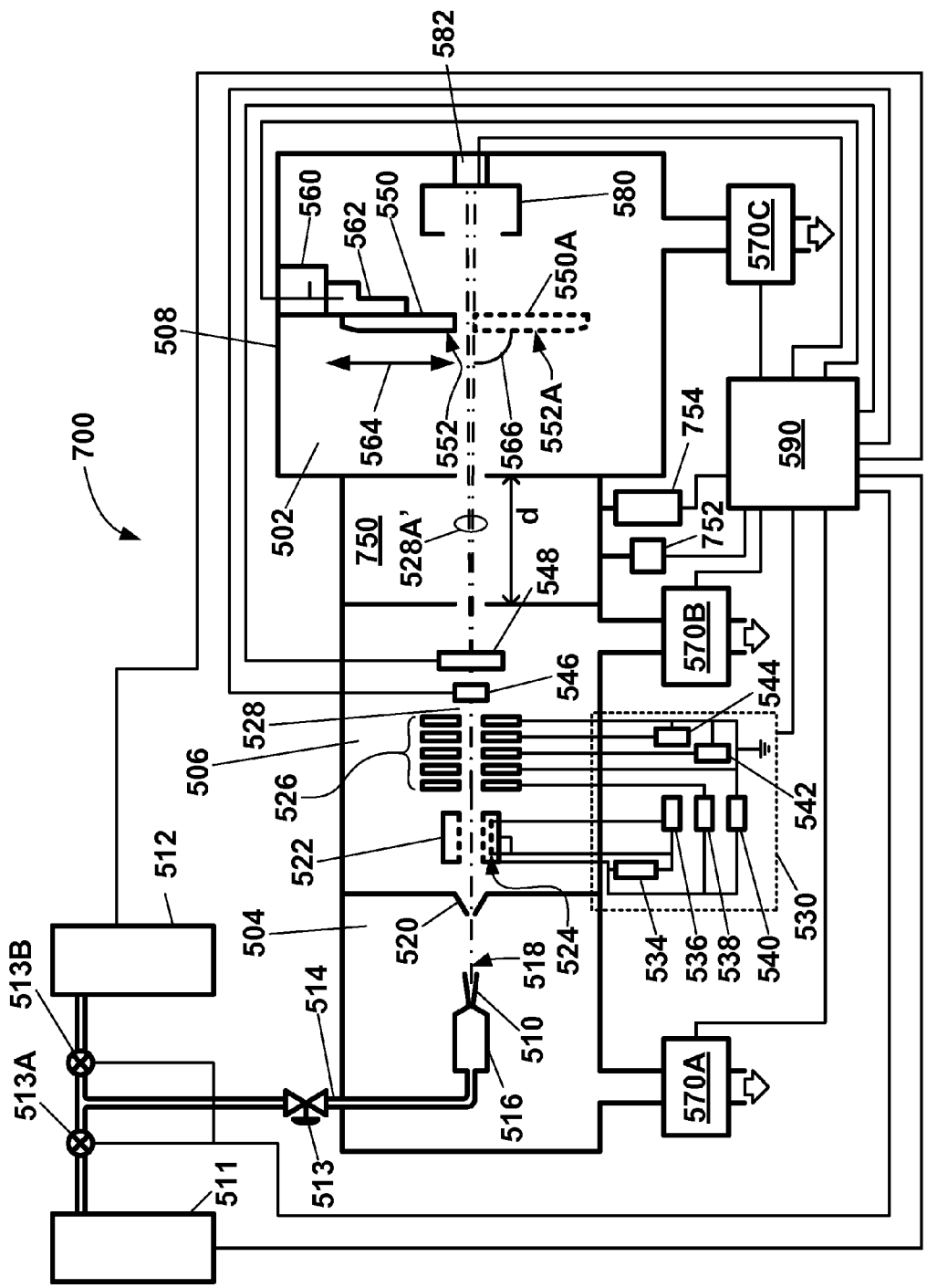
FIG. 7 is yet another illustration of a GCIB processing system.

In the embodiment shown in FIG. 7, the GCIB processing system 700 can be similar to the embodiment of FIG. 5 and further comprise a pressure cell chamber 750 positioned, for example, at or near an outlet region of the ionization/acceleration chamber 506. The pressure cell chamber 750 comprises an inert gas source 752 configured to supply a background gas to the pressure cell chamber 750 for elevating the pressure in the pressure cell chamber 750, and a pressure sensor 754 configured to measure the elevated pressure in the pressure cell chamber 750.

The pressure cell chamber 750 may be configured to modify the beam energy distribution of GCIB 528 to produce a modified processing GCIB 528A'. This modification of the beam energy distribution is achieved by directing GCIB 528 along a GCIB path through an increased pressure region within the pressure cell chamber 750 such that at least a portion of the GCIB traverses the increased pressure region. The extent of modification to the beam energy distribution may be characterized by a pressure-distance integral along the at least a portion of the GCIB path, where distance (or length of the pressure cell chamber 750) is indicated by path length (d). When the value of the pressure-distance integral is increased (either by increasing the pressure and/or the path length (d)), the beam energy distribution is broadened and the peak energy is decreased. When the value of the pressure-distance integral is decreased (either by decreasing the pressure and/or the path length (d)), the beam energy distribution is narrowed and the peak energy is increased. Further details for the design of a pressure cell may be determined from U.S. Pat. No. 7,060,989, entitled "Method and apparatus for improved processing with a gas-cluster ion beam"; the content of which is incorporated herein by reference in its entirety.

Control system 590 comprises a microprocessor, memory, and a digital I/O port capable of generating control voltages sufficient to communicate and activate inputs to GCIB processing system 500 (or 600, 700), as well as monitor outputs from GCIB processing system 500 (or 600, 700). Moreover, control system 590 can be coupled to and can exchange information with vacuum pumping systems 570A, 570B, and 570C, first gas source 511, second gas source 512, first gas control valve 513A, second gas control valve 513B, beam electronics 530, beam filter 546, beam gate 548, the X-scan actuator 160, the Y-scan actuator 562, and beam current sensor 580. For example, a program stored in the memory can be utilized to activate the inputs to the aforementioned components of GCIB processing system 500 according to a process recipe in order to perform a GCIB process on substrate 552.

However, the control system 590 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The control system 590 can be used to configure any number of processing elements, as described above, and the control system 590 can collect, provide, process, store, and display data from processing elements. The control system 590 can include a number of applications, as well as a number of controllers, for controlling one or more of the processing elements. For example, control system 590 can include a graphic user interface (GUI) component (not shown) that can provide interfaces that enable a user to monitor and/or control one or more processing elements.

Control system 590 can be locally located relative to the GCIB processing system 500 (or 600, 700), or it can be remotely located relative to the GCIB processing system 500 (or 600, 700). For example, control system 590 can exchange data with GCIB processing system 500 using a direct connection, an intranet, and/or the Internet. Control system 590 can be coupled to an intranet at, for example, a customer site (i.e., a device maker, etc.), or it can be coupled to an intranet at, for example, a vendor site (i.e., an equipment manufacturer). Alternatively or additionally, control system 590 can be coupled to the Internet. Furthermore, another computer (i.e., controller, server, etc.) can access control system 590 to exchange data via a direct connection, an intranet, and/or the Internet.

Substrate 552 (or 652) can be affixed to the substrate holder 550 (or substrate holder 650) via a clamping system (not shown), such as a mechanical clamping system or an electrical clamping system (e.g., an electrostatic clamping system). Furthermore, substrate holder 550 (or 650) can include a heating system (not shown) or a cooling system (not shown) that is configured to adjust and/or control the temperature of substrate holder 550 (or 650) and substrate 552 (or 652).

Vacuum pumping systems 570A, 570B, and 570C can include turbo-molecular vacuum pumps (TMP) capable of pumping speeds up to about 5000 liters per second (and greater) and a gate valve for throttling the chamber pressure. In conventional vacuum processing devices, a 1000 to 3000 liter per second TMP can be employed. TMPs are useful for low pressure processing, typically less than about 50 mTorr. Although not shown, it may be understood that pressure cell chamber 750 may also include a vacuum pumping system. Furthermore, a device for monitoring chamber pressure (not shown) can be coupled to the vacuum vessel 502 or any of the three vacuum chambers 504, 506, 508. The pressure-measuring device can be, for example, a capacitance manometer or ionization gauge.

In other embodiments, gas GCIB processing systems 500, 600, 700 may include the secondary gas source (not shown) arranged to deliver a secondary gas into the processing system downstream of the exit 518 of the nozzle assembly 510. In another embodiment, the secondary gas source is arranged to deliver the secondary gas into the ionization/acceleration chamber 506 downstream of a skimmer 520. In another embodiment, the secondary gas source is arranged to deliver the secondary gas into the processing chamber 508 downstream of a final aperture. In another embodiment, any combination of the above described implementations of the secondary gas source may be used. Additional details concerning the design of a multiple gas cluster ion beam system are provided in U.S. Patent Application Ser. No. 62/046,878, entitled "Process Gas Enhancement for GCIB Treatment of a Substrate" and filed on Sep. 5, 2014.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method for patterning a substrate, comprising:
   receiving a substrate having a patterned layer, the patterned layer defining a first mandrel pattern, wherein a first material layer of a first composition is conformally deposited over the first mandrel pattern;
   partially removing the first material layer using a first gas cluster ion beam (GCIB) etching process to expose a top surface of the first mandrel pattern, open a portion of the first material layer at a bottom region adjacent a feature of the first mandrel pattern, and retain a remaining portion of the first material layer on sidewalls of the first mandrel pattern, wherein the first GCIB etching process includes forming a first GCIB from a first pressurized gas mixture containing a material suitable for etching the first material;
   selectively removing the first mandrel pattern using one or more etching processes to leave a second mandrel pattern comprising the remaining portion of the first material layer that remained on the sidewalls of the first mandrel pattern;
   conformally depositing a second material layer of a second composition, over the second mandrel pattern, the second composition being different from the first composition;
   partially removing the second material layer using a second gas cluster ion beam (GCIB) etching process to expose a top surface of the second mandrel pattern, open a portion of the second material layer at a bottom region adjacent a feature of the second mandrel pattern, and retain a remaining portion of the second material layer on sidewalls of the second mandrel pattern, wherein the second GCIB etching process includes forming a second GCIB from a second pressurized gas mixture containing a material suitable for etching the second material;

selectively removing the second mandrel pattern using one or more etching processes to leave a third mandrel pattern comprising the remaining portion of the second material layer that remained on the sidewalls of the second mandrel pattern;

selecting target etch process metrics for the second GCIB etching process, the target etch process metrics including a target etch selectivity between the second material layer and the first material layer, and at least one of a target surface roughness of the second material layer and a target surface roughness of the first material layer; and establishing a GCIB process condition including GCIB properties for the second GCIB etching process to achieve the target etch process metrics, the process condition including setting a process composition, and setting a flow rate of at least one constituent in the pressurized gas mixture of the second GCIB, a beam acceleration potential, and at least one of a background gas pressure or a background gas flow rate for an increased pressure region through which the second GCIB passes.

2. The method of claim 1, wherein the patterned layer includes a patterned silicon oxide layer, and the first material layer includes a silicon nitride layer.

3. The method of claim 1, wherein the patterned layer includes a patterned photo-sensitive material, the first material layer includes silicon oxide, and the second material layer includes silicon nitride.

4. The method of claim 1, wherein the target surface roughness for the first material layer and/or the second material layer is less than or equal to 5 Angstroms.

5. The method of claim 1, wherein the target etch selectivity is greater than or equal to 2.

6. The method of claim 1, wherein the patterned layer includes a patterned photo-sensitive material, and the first material layer includes a silicon containing material, a carbon containing material, or a metal containing material.

7. The method of claim 6, wherein the first material layer includes silicon oxide, silicon nitride, amorphous carbon, or metal oxide.

8. The method of claim 1, wherein the first and second GCIB etching processes include performing the following:
maintaining a reduced-pressure environment around a substrate holder for holding the substrate;
holding the substrate securely within the reduced-pressure environment
accelerating the first GCIB and second GCIB, respectively; and
irradiating at least a portion of the first GCIB and second GCIB, respectively, onto at least a portion of the substrate.

9. The method of claim 8, wherein the first and/or second pressurized gas mixture contains a halogen-containing gas, a halomethane, or a halosilane, or a combination of two or more thereof.

10. The method of claim 9, wherein the first and/or second pressurized gas mixture includes CHF3, or SiF4, or both.

11. The method of claim 9, wherein the first and/or second pressurized gas mixture includes a noble gas element, or N2, or both.

12. The method of claim 9, wherein the first and/or second pressurized gas mixture contains one or more elements selected from the group consisting of B, C, H, Si, Ge, N, P, As, O, S, F, Cl, and Br.

13. A method for patterning a substrate, comprising:
receiving a substrate having a patterned layer, the patterned layer defining a first mandrel pattern, wherein a first material layer of a first composition is conformally deposited over the first mandrel pattern;
partially removing the first material layer using a first gas cluster ion beam (GCIB) etching process with a first GCIB to expose a top surface of the first mandrel pattern, open a portion of the first material layer at a bottom region adjacent a feature of the first mandrel pattern, and retain a remaining portion of the first material layer on sidewalls of the first mandrel pattern;
selectively removing the first mandrel pattern using one or more etching processes to leave a second mandrel pattern comprising the remaining portion of the first material layer that remained on the sidewalls of the first mandrel pattern;
conformally depositing a second material layer of a second composition, over the second mandrel pattern, the second composition being different from the first composition;
partially removing the second material layer using a second gas cluster ion beam (GCIB) etching process with a second GCIB to expose a top surface of the second mandrel pattern, open a portion of the second material layer at a bottom region adjacent a feature of the second mandrel pattern, and retain a remaining portion of the second material layer on sidewalls of the second mandrel pattern; and
selectively removing the second mandrel pattern using one or more etching processes to leave a third mandrel pattern comprising the remaining portion of the second material layer that remained on the sidewalls of the second mandrel pattern,
wherein the first and second GCIB etching processes include performing the following:
maintaining a reduced-pressure environment around a substrate holder for holding the substrate;
holding the substrate securely within the reduced-pressure environment;
forming the first GCIB from a first pressurized gas mixture containing a material suitable for selectively etching the first material relative to material of the patterned layer and forming the second GCIB from a second pressurized gas mixture containing a material suitable for selectively etching the second material relative to the first material;
accelerating the first and second GCIBs;
irradiating at least a portion of the first and second GCIBs onto at least a portion of the substrate;
selecting target etch process metrics for the first and second GCIB etching processes, the target etch process metrics including a target etch selectivity between the second material layer and the first material layer, and at least one of a target surface roughness of the second material layer and a target surface roughness of the first material layer; and
establishing a GCIB process condition including GCIB properties for the second GCIB etching process to achieve the target etch process metrics, the process condition including setting a process composition, and setting a flow rate of at least one constituent in the pressurized gas mixture of the second GCIB, a beam acceleration potential, and at least one of a background gas pressure or a background gas flow rate for an increased pressure region through which the second GCIB passes.

14. The method of claim 13, wherein the patterned layer includes a patterned photo-sensitive material, the first material layer includes silicon oxide, and the second material layer includes silicon nitride.

15. The method of claim 13, wherein the first and/or second pressurized gas mixture contains a halogen-containing gas, a halomethane, or a halosilane, or a combination of two or more thereof.

16. The method of claim 13, wherein the first and/or second pressurized gas mixture includes CHF3, or SiF4, or both.

17. The method of claim 13, wherein the first and/or second pressurized gas mixture includes a noble gas element, or N2, or both.

18. The method of claim 13, wherein the first and/or second pressurized gas mixture contains one or more elements selected from the group consisting of B, C, H, Si, Ge, N, P, As, O, S, F, Cl, and Br.

19. The method of claim 13, wherein the target surface roughness for the first material layer and/or the second material layer is less than or equal to 5 Angstroms.

20. The method of claim 13, wherein the target etch selectivity is greater than or equal to 2.

* * * * *

UNITED STATES PATENT AND TRADEMARK OFFICE
CERTIFICATE OF CORRECTION

| | | |
|---|---|---|
| PATENT NO. | : 9,500,946 B2 | Page 1 of 2 |
| APPLICATION NO. | : 14/661411 | |
| DATED | : November 22, 2016 | |
| INVENTOR(S) | : Soo Doo Chae et al. | |

It is certified that error appears in the above-identified patent and that said Letters Patent is hereby corrected as shown below:

In the Specification

In Column 5, Lines 44-45, "the first material layer 130 characterized by" should read --the first material layer 130 is characterized by--.

In Column 6, Line 3, "and even 50% the initial" should read --and even 50% of the initial--.

In Column 8, Lines 9-10, "are provided in are provided in U.S. Pat. No." should read --are provided in U.S. Pat. No.--.

In Column 8, Line 50, "GCIB to according to" should read --GCIB according to--.

In Column 9, Line 65, "towards substrate according" should read --towards the substrate according--.

In Column 10, Line 62, "material from substrate." should read --material from the substrate.--.

In Column 10, Line 65, "halogen-containing residue, from substrate." should read --halogen-containing residue, from the substrate.--.

In Column 16, Line 18, "is performed" should read --are performed--.

In the Claims

In Column 21, Line 53, Claim 8, "environment" should read --environment;--.

In Column 21, Line 64, Claim 10, "includes CHF3, or SiF4, or both." should read --includes $CHF_3$, or $SiF_4$, or both.--.

In Column 21, Line 66, Claim 11, "or N2," should read --or $N_2$,--.

Signed and Sealed this
Twenty-first Day of March, 2017

Michelle K. Lee
*Director of the United States Patent and Trademark Office*

CERTIFICATE OF CORRECTION (continued)
U.S. Pat. No. 9,500,946 B2

In Column 23, Line 14, Claim 16, "includes CHF3, or SiF4, or" should read --includes $CHF_3$, or $SiF_4$, or--.

In Column 23, Line 18, Claim 17, "or N2, or both." should read --or $N_2$, or both.--.